US007706907B2

(12) United States Patent
Hiroki

(10) Patent No.: US 7,706,907 B2
(45) Date of Patent: Apr. 27, 2010

(54) SUBSTRATE PROCESSING APPARATUS, SUBSTRATE PROCESSING METHOD, COMPUTER PROGRAM, AND STORAGE MEDIUM

(75) Inventor: Tsutomu Hiroki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 253 days.

(21) Appl. No.: 11/806,668

(22) Filed: Jun. 1, 2007

(65) Prior Publication Data

US 2008/0071408 A1 Mar. 20, 2008

(30) Foreign Application Priority Data

Jun. 2, 2006 (JP) ............................. 2006-155275

(51) Int. Cl.
*H01L 21/68* (2006.01)
*G06F 19/00* (2006.01)

(52) U.S. Cl. ....................... 700/114; 700/254; 700/258; 414/416.03; 414/416.08

(58) Field of Classification Search ................. 700/114, 700/254, 258; 318/568.13, 568.14, 574; 414/416.03

See application file for complete search history.

(56) References Cited

U.S. PATENT DOCUMENTS 5,813,819 A * 9/1998 Ohsawa et al. .......... 414/416.08
6,144,926 A * 11/2000 Ishizawa et al. ............... 702/94
6,298,280 B1 * 10/2001 Bonora et al. ............... 700/218
6,532,403 B2 * 3/2003 Beckhart et al. ............ 700/254
6,591,161 B2 * 7/2003 Yoo et al. .................... 700/218

FOREIGN PATENT DOCUMENTS

JP            07-201952         8/1995

* cited by examiner

*Primary Examiner*—Ramesh B Patel
*Assistant Examiner*—Douglas S Lee
(74) *Attorney, Agent, or Firm*—Smith, Gambrell & Russell, LLP

(57) ABSTRACT

A substrate processing apparatus is provided, which can place a substrate in a correct position, even though a positional error occurs between the substrate carried in a processing vessel and a placing table. This substrate processing apparatus can take a necessary action immediately against a positional error of the substrate generated when the substrate is separated from the placing table after completion of a process. The plasma apparatus 1 includes a processing vessel 11, lifting pins 34 provided in the processing vessel 11, and a detecting head 22. A wafer W is carried into the processing vessel 11 from the exterior of the processing vessel 11 by using a carrying apparatus 6, and is stopped in a transferring position above the lifting pins 34. Thereafter, the detecting head 22 is moved from an evacuation position to a detection position, so as to obtain positional error information between a current position in which the wafer W is currently held and a programmed position in which the transfer of the wafer W is to be carried out. Based on the positional error information, the transferring position of the wafer W is corrected by using the carrying apparatus 6, such that an amount of the positional error between the current position W and the programmed position is within an allowable range.

21 Claims, 8 Drawing Sheets

(a)

(b)

(a)

(b)

SUBSTRATE PROCESSING APPARATUS, SUBSTRATE PROCESSING METHOD, COMPUTER PROGRAM, AND STORAGE MEDIUM

CROSS REFERENCE TO RELATED APPLICATIONS

This application is based upon the prior Japanese Patent Application No. 2006-155275 filed on Jun. 2, 2006, the entire contents of which are incorporated herein by reference.

BACKGROUND OF THE INVENTION

1. Field of the Invention

The present invention relates to a technique for detecting a position of a substrate and a technique for correcting the position of the substrate, in a processing vessel for providing a process, such as a plasma etching process and/or CVD process, to the substrate, for example, a semiconductor wafer.

2. Background Art

In a process for manufacturing a flat panel, such as a semiconductor device or liquid crystal display device, a substrate processing apparatus, such as a plasma etching apparatus or CVD apparatus, is used to provide a process, including etching and/or film forming, to a substrate, such as a semiconductor wafer (hereinafter, referred to as a wafer) or glass plate.

Hereinafter, a parallel flat plate type plasma etching apparatus for providing a plasma process to a wafer will be described by way of example. The plasma etching apparatus of this type includes a processing vessel adapted to provide a process to a wafer, a wafer placing table provided in the processing vessel and used also as a lower electrode, and a shower head provided above the placing table and constituting an upper electrode. Vacuum is applied into the processing vessel by using a vacuum pump, and high frequency voltage for generating plasma is then applied to the placing table by using a high frequency power source, so as to generate plasma between the placing table and the shower head, whereby a processing gas introduced into the processing vessel from a gas supply chamber can be activated by the plasma. Thus, an etching process due to such plasma is provided to the wafer placed on the placing table.

Upon mounting the wafer on the placing table, the wafer is carried into the processing vessel from the outside, by using a carrying apparatus, and the carrying apparatus is then stopped in a predetermined transferring position, and thereafter three lifting pins (transfer means) are projected out from a top placing face of the placing table, so as to transfer the wafer onto the lifting pins. On the periphery of the top face of the placing table, a ring-like member, which is called focus ring, is provided for controlling the plasma, wherein the wafer is placed in a predetermined position (hereinafter, referred to as a placing position) in a recess surrounded by the focus ring. Thereafter, when the lifting pins holding the wafer thereon are lowered, the wafer is transferred to the placing position.

In a semiconductor manufacturing factory, a multi-chamber system is often used as a vacuum processing apparatus, such as a plasma etching apparatus or the like, in which a plurality of vacuum chambers (processing vessels) are airtightly connected with a carrying chamber, which is also used as a vacuum chamber and includes a carrying apparatus therein. In this case, for example, by utilizing an alignment mechanism including a rotary stage and an optical sensor in the carrying chamber, the wafer can be held accurately in a predetermined position where the wafer is to be transferred onto the lifting pins from the carrying apparatus. In the carrying apparatus, however, errors tend to occur in driving systems due to stretch or the like of driving belts provided in the carrying apparatus, and/or deformation is likely to occur in each chamber due to pressure to be applied to the large-sized carrying apparatus by the application of vacuum. Because of these factors, the central position of the wafer may be shifted from the central position of the placing table when the wafer is located on the placing table. For example, in the case of carrying out processes, in succession, by carrying the wafer to one processing vessel after another in the multi-chamber system, since errors between the carrying apparatus and the wafer are accumulated, a significant positional error or difference may occur between the wafer transferring position for transferring the wafer from the carrying arm onto the lifting pins and the placing position of the placing table. Therefore, if continuing such a mounting operation of the wafer while leaving the positional error as it is, the wafer may tend to ride on the focus ring surrounding the wafer placing position, thus making it difficult to perform a normal process, and the placing table which is not completely covered due to such a centered-off wafer may tend to be exposed to the plasma and thus damaged therewith. In addition, such improper mounting of the wafer onto the placing position (i.e., the positional error between the respective central positions) may also lead to having negative impact on the yield of products. Furthermore, in assessment on the process provided to the wafer, for example, in assessment on a profile of the etching rate in the surface of the wafer, factors to be attributed to the process parameters can not be distinguished from factors to be attributed to the aforementioned positional error of the wafer, as such making it difficult to analyze obtained data correctly and to carry out assessment accurately.

Moreover, because vacuum chuck can not be utilized in the vacuum processing apparatus, such as a plasma etching apparatus, as described above, the wafer is held by the placing table by using an electrostatic chuck utilizing coulomb force or Johnson-Rahbek force. The fixation of the wafer due to such electrostatic chuck is released after completion of the etching process. However, an electric charge may tend to remain in the electrostatic chuck even after the so-called de-chucking. If attempting to raise the lifting pins and transfer the wafer to the carrying apparatus in such a state, the wafer may tend to leap upward due to strong force to be applied by the lifting pins or otherwise be raised up obliquely. This is called de-chucking error. Furthermore, if continuing operation of the carrying apparatus, irrespectively of occurrence of such a de-chucking error, failures of transfer of the wafer to the carrying apparatus and/or falling of the wafer from the carrying apparatus due to its collision with a transfer port of each processing vessel may occur.

To address these problems, Patent Document 1 describes a technique for detecting a current position of a wafer held by a carrying apparatus by using a photo-sensor, by attaching the photo-sensor for detecting the position of the wafer to a placing face of a placing table and/or a wall portion of each processing vessel. According to this technique, if the current position of the wafer is shifted relative to a position in which the wafer transfer is to be carried out (i.e., a position in which the central position of the wafer is coincident with the central position of the placing table, and this position will be referred to, hereinafter, as a programmed position), the transfer operation can be carried out after the wafer transferring position has been corrected by moving the carrying means.

However, in the Patent Document 1, the photo-sensor of a type to be attached to a wall portion of each processing vessel is configured to detect the wafer position based on whether sensor light emitted in an oblique direction is blocked by the wafer or not. Therefore, the shading area of the sensor light beam is significantly large, thus making it difficult to accurately measure fine differences. In addition, a relatively long optical path of the sensor light renders adjustment of attaching positions of a light-emitting sensor and a light-receiving sensor significantly difficult. Furthermore, deformation of the placing table to be caused by multiple exposure processes under high temperature conditions due to plasma may substantially shift the placing position of the wafer. However, since the photo-sensor attached to the processing vessel is adapted to confirm only the wafer position, it can not be used to correct the positional error caused by factors on the side of the placing table.

On the other hand, the photo-sensor of a type to be attached to the placing table grasps the wafer position by irradiating the periphery of the wafer with light and detecting the reflected light. Accordingly, the photo-sensor is attached to the top face of the placing table while being projected out the periphery of the wafer. Therefore, in some cases, the photo-sensor can not be completely covered with the wafer even after the wafer is placed on the placing table. In such a case, a part of the photo-sensor, which is not covered with the wafer, is exposed to plasma, and is hence likely to be damaged. Moreover, the placing table used in the plasma etching apparatus has a complicated structure because it includes an electrostatic chuck for fixing the wafer and a fluid passage for supplying a back side gas for enhancing heat conductivity between the placing face and the wafer rear face, in addition to the lifting pins described above. Accordingly, these elements should make the structure of the placing table more complicated and thus impractical.

In the above Patent Document 1, while a method for correcting the positional error, upon carrying the wafer into the plasma etching apparatus, by using the carrying apparatus is described, no measures for addressing the positional error associated with the de-chucking error are described.

Patent Document 1: TOKUKAIHEI No. 7-201952, KOHO: page 3~, paragraphs [0009] to [0015]

SUMMARY OF THE INVENTION

The present invention was made in light of the above circumstances, and therefore, it is an object of this invention to provide a substrate processing apparatus, a substrate processing method, and a computer program for use in the method, and a storage medium for storing the computer program, which can place a substrate in a correct position, even though some positional error occurs between the substrate carried in a processing vessel and a placing table. It is another object of this invention to provide a substrate processing apparatus, a substrate processing method, and a storage medium for storing a program for use in the method, which can take some necessary action at once against a positional error to be generated on a substrate, which has been detached from a placing table, after completion of a process.

The present invention is a substrate processing apparatus, comprising: a processing vessel; a placing table provided in the processing vessel; a substrate carrying means adapted to carry a substrate between the interior and the exterior of the processing vessel; a transfer means provided in the processing vessel, such that it can be raised and lowered; a detecting head adapted to optically detect the outer periphery of the substrate located in a substrate transferring position above the transfer means; a driving means adapted to move the detecting head between a detection position in which the outer periphery of the substrate is detected and an evacuation position which is spaced away from a substrate transferring region; an calculation means adapted to obtain positional error information comprising, an amount of a positional error and a direction of the positional error between a current position of the substrate and a programmed position of the substrate, based on detection results from the detecting head; and a control means adapted to correct a substrate transferring position of the substrate above the transfer means, by operating the substrate carrying means, such that the amount of the positional error between the current position of the substrate and the programmed position of the substrate is within an allowable range, based on the positional error information from the calculation means.

The present invention is the substrate processing apparatus described above, further comprising a warning means adapted to issue a warning when the amount of the positional error between the current position of the substrate and the programmed position of the substrate is out of the allowable range.

The present invention is a substrate processing apparatus, comprising: a processing vessel; a placing table provided in the processing vessel; a substrate carrying means adapted to carry a substrate between the interior and the exterior of the processing vessel; a transfer means provided in the processing vessel, such that it can be raised and lowered; a detecting head adapted to optically detect the outer periphery of the substrate located in a substrate transferring position above the transfer means; a driving means adapted to move the detecting head between a detection position in which the outer periphery of the substrate is detected and an evacuation position which is spaced away from a substrate transferring region; an calculation means adapted to obtain positional error information comprising, an amount of a positional error and a direction of the positional error between a current position of the substrate and a programmed position of the substrate, based on detection results from the detecting head; and a warning means adapted to issue a warning when the amount of the positional error between the current position of the substrate and the programmed position of the substrate is out of an allowable range, based on the positional error information from the calculation means.

The present invention is the substrate processing apparatus described above, wherein the detecting head is adapted to optically detect the outer periphery of the substrate.

The present invention is the substrate processing apparatus described above, wherein the placing table includes an electrostatic chuck.

The present invention is the substrate processing apparatus described above, wherein the detecting head is configured to optically detect the outer periphery of the substrate and the outer periphery of the placing table, and wherein the calculation means is configured to obtain a central position of the substrate based on the detection results for the outer periphery of the substrate and obtain a central position of the placing table based on the detection results for the outer periphery of the placing table, so as to obtain the positional error information comprising the amount of a positional error and the direction of the positional error.

The present invention is the substrate processing apparatus described above, wherein the detection position of the detecting head is located between the substrate and the placing table.

The present invention is the substrate processing apparatus described above, wherein the detecting head is housed in a wall portion of the processing vessel when it is in the evacuation position.

The present invention is a substrate processing method for performing a process to a substrate, in a substrate processing apparatus, the substrate processing apparatus including: a processing vessel; a placing table provided in the processing vessel; a substrate carrying means adapted to carry the substrate between the interior and the exterior of the processing vessel; and a transfer means provided in the processing vessel, such that it can be raised and lowered, wherein the method comprises the steps of: moving a detecting head to a detection position, the detecting head being adapted to detect an outer periphery of the substrate; optically detecting the outer periphery of the substrate located in a substrate transferring position above the transfer means, by using the detecting head; moving the detecting head to an evacuation position spaced away from a substrate transferring region, by using a driving means; obtaining positional error information comprising, an amount of a positional error and a direction of the positional error between a current position of the substrate and a programmed position of the substrate, by using an calculation means, based on detection results from the detecting head; and correcting a substrate transferring position, by operating the substrate carrying means by using a control means, such that the amount of the positional error between the current position of the substrate and the programmed position of the substrate is within an allowable range, based on the positional error information from the calculation means.

The present invention is the substrate processing method described above, further comprising the step of issuing a warning when the amount of the positional error between the current position of the substrate and the programmed position of the substrate is out of the allowable range.

The present invention is a substrate processing method for performing a process to a substrate, in a substrate processing apparatus, the substrate processing apparatus including: a processing vessel; a placing table provided in the processing vessel; a substrate carrying means adapted to carry the substrate between the interior and the exterior of the processing vessel; and a transfer means provided in the processing vessel, such that it can be raised and lowered, wherein the method comprises the steps of: moving a detecting head to a detection position, the detecting head being adapted to detect an outer periphery of the substrate; optically detecting the outer periphery of the substrate located in a substrate transferring position above the transfer means, by using the detecting head; moving the detecting head to an evacuation position spaced away from a substrate transferring region, by using a driving means; obtaining positional error information comprising, an amount of a positional error and a direction of the positional error between a current position of the substrate and a programmed position of the substrate, by using an calculation means, based on detection results from the detecting head; and issuing a warning when the amount of the positional error between the current position of the substrate and the programmed position of the substrate is out of the allowable range, based on the positional error information from the calculation means.

The present invention is the substrate processing method described above, further comprising the step of carrying the substrate to a transferring position above the transfer means, from the exterior of the processing vessel, by using the substrate carrying means, before the detecting head is moved to the detection position.

The present invention is the substrate processing method described above, further comprising the step of moving the substrate placed on the placing table to a transferring position above the transfer means, by raising the transfer means in the processing vessel, before the detecting head is moved to the detection position.

The present invention is the substrate processing method described above, wherein the placing table includes an electrostatic chuck.

The present invention is the substrate processing method described above, wherein the detecting head is adapted to optically detect the outer periphery of the substrate as well as the outer periphery of the placing table, and wherein the step of obtaining the positional error information by using the calculation means includes obtaining a central position of the substrate based on the detection results for the outer periphery of the substrate and obtaining a central position of the placing table based on the detection results for the outer periphery of the placing table, so as to obtain positional error information comprising, the amount of the positional error and the direction of the positional error between the current position of the substrate and the programmed position of the substrate.

The present invention is the substrate processing method described above, wherein the detection position of the substrate is located between the substrate and the placing table.

The present invention is the substrate processing method described above, wherein the detecting head is housed in a wall portion of the processing vessel when it is in the evacuation position.

The present invention is a computer program for executing a substrate processing method by using a computer, wherein the substrate processing method is for use in performing a process to a substrate, in a substrate processing apparatus, the substrate processing apparatus including: a processing vessel; a placing table provided in the processing vessel; a substrate carrying means adapted to carry the substrate between the interior and the exterior of the processing vessel; and a transfer means provided in the processing vessel, such that it can be raised and lowered, and wherein the substrate processing method comprises the steps of: moving a detecting head to a detection position, the detecting means being adapted to detect an outer periphery of the substrate; optically detecting the outer periphery of the substrate located in a substrate transferring position above the transfer means, by using the detecting head; moving the detecting head to an evacuation position spaced away from a substrate transferring region, by using a driving means; obtaining positional error information comprising, an amount of a positional error and a direction of the positional error between a current position of the substrate and a programmed position of the substrate, by using an calculation means, based on detection results from the detecting head; and correcting a substrate transferring position, by operating the substrate carrying means by using a control means, such that the amount of the positional error between the current position of the substrate and the programmed position of the substrate is within an allowable range, based on the positional error information from the calculation means.

The present invention is a computer program for executing a substrate processing method by using a computer, wherein the substrate processing method is for use in performing a process to a substrate, in a substrate processing apparatus, the substrate processing apparatus including: a processing vessel; a placing table provided in the processing vessel; a substrate carrying means adapted to carry the substrate between the interior and the exterior of the processing vessel; and a transfer means provided in the processing vessel, such that it can be raised and lowered, and wherein the substrate processing method comprises the steps of: moving a detecting head to a detection position, the detecting means being adapted to detect an outer periphery of the substrate; optically detecting the outer periphery of the substrate located in a substrate transferring position above the transfer means, by using the detecting head; moving the detecting head to an evacuation position spaced away from a substrate transferring region, by using a driving means; obtaining positional error information comprising, an amount of a positional error and a direction of the positional error between a current position of the substrate and a programmed position of the substrate, by using an calculation means, based on detection results from the detecting head; and issuing a warning when the amount of the positional error between the current position of the substrate and the programmed position of the substrate is out of the allowable range, based on the positional error information from the calculation means.

The present invention is a storage medium storing a computer program for executing a substrate processing method by using a computer, wherein the substrate processing method is for use in performing a process to a substrate, in a substrate processing apparatus, the substrate processing apparatus including: a processing vessel; a placing table provided in the processing vessel; a substrate carrying means adapted to carry the substrate between the interior and the exterior of the processing vessel; and a transfer means provided in the processing vessel, such that it can be raised and lowered, and wherein the substrate processing method comprises the steps of: moving a detecting head to a detection position, the detecting means being adapted to detect an outer periphery of the substrate; optically detecting the outer periphery of the substrate located in a substrate transferring position above the transfer means, by using the detecting head; moving the detecting head to an evacuation position spaced away from a substrate transferring region, by using a driving means; obtaining positional error information comprising, an amount of a positional error and a direction of the positional error between a current position of the substrate and a programmed position for the substrate, by using an calculation means, based on detection results from the detecting head; and correcting the substrate transferring position, by operating the substrate carrying means by using a control means, such that the amount of the positional error between the current position of the substrate and the programmed position is within an allowable range, based on the positional error information to be obtained from the calculation means.

The present invention is a storage medium storing a computer program for executing a substrate processing method by using a computer, wherein the substrate processing method is for use in performing a process to a substrate, in a substrate processing apparatus, the substrate processing apparatus including: a processing vessel; a placing table provided in the processing vessel; a substrate carrying means adapted to carry the substrate between the interior and the exterior of the processing vessel; and a transfer means provided in the processing vessel, such that it can be raised and lowered, and wherein the substrate processing method comprises the steps of: moving a detecting head to a detection position, the detecting means being adapted to detect an outer periphery of the substrate; optically detecting the outer periphery of the substrate located in a substrate transferring position above the transfer means, by using the detecting head; moving the detecting head to an evacuation position spaced away from the substrate transferring region, by using a driving means; obtaining positional error information comprising, an amount of a positional error and a direction of the positional error between a current position of the substrate and a programmed position of the substrate, by using an calculation means, based on detection results from the detecting head; and issuing a warning when the amount of the positional error between the current position of the substrate and the programmed position is out of the allowable range, based on the positional error information from the calculation means.

According to the present invention, since the position of the substrate is optically detected by using the detecting head, in the transferring position above the transfer means, such as lifting pins, so as to correct the substrate transferring position based on the results of the detection, the substrate can be placed in a correct position on the placing table. Consequently, for example, in a plasma etching apparatus, trouble to be caused by the substrate which would ride on the focus ring and problems in the process to be associated with a positional error of the substrate can be avoided, and additionally more accurate assessment can be achieved for the results of processing the substrate. In addition, since the detecting head can be moved between the detection position and the evacuation position which is located outside the substrate transferring region, the outer periphery of the substrate can be detected with higher accuracy, and additionally complicated configuration of the placing table can be avoided. Furthermore, with the detecting head which can be completely housed in a wall portion of the processing vessel when it is in the evacuation position, for example, upon performing a process, the detecting head can be seen as a part of the wall face of the processing vessel. Thus, no trouble is caused, during the process, due to the provision of such a detecting head.

According to another aspect of the present invention, the substrate having been already processed is raised, by using the lifting pins, from the placing table, and the position of the substrate is optically detected by using the detecting head, so as to issue a warning based on the results of the detection. Thus, the operator can immediately take some necessary action, or the transferring position can be corrected automatically by the carrying apparatus, in response to the warning. As such, falling of the substrate from the carrying apparatus due to its collision with a transfer port of the processing vessel can be prevented. Additionally, the correction of the substrate transferring position based on the detection results can achieve a reliable substrate conveyance onto a correct position in a place to which the substrate is to be transferred.

DETAILED DESCRIPTION OF THE INVENTION

EXAMPLES

Figure 1:
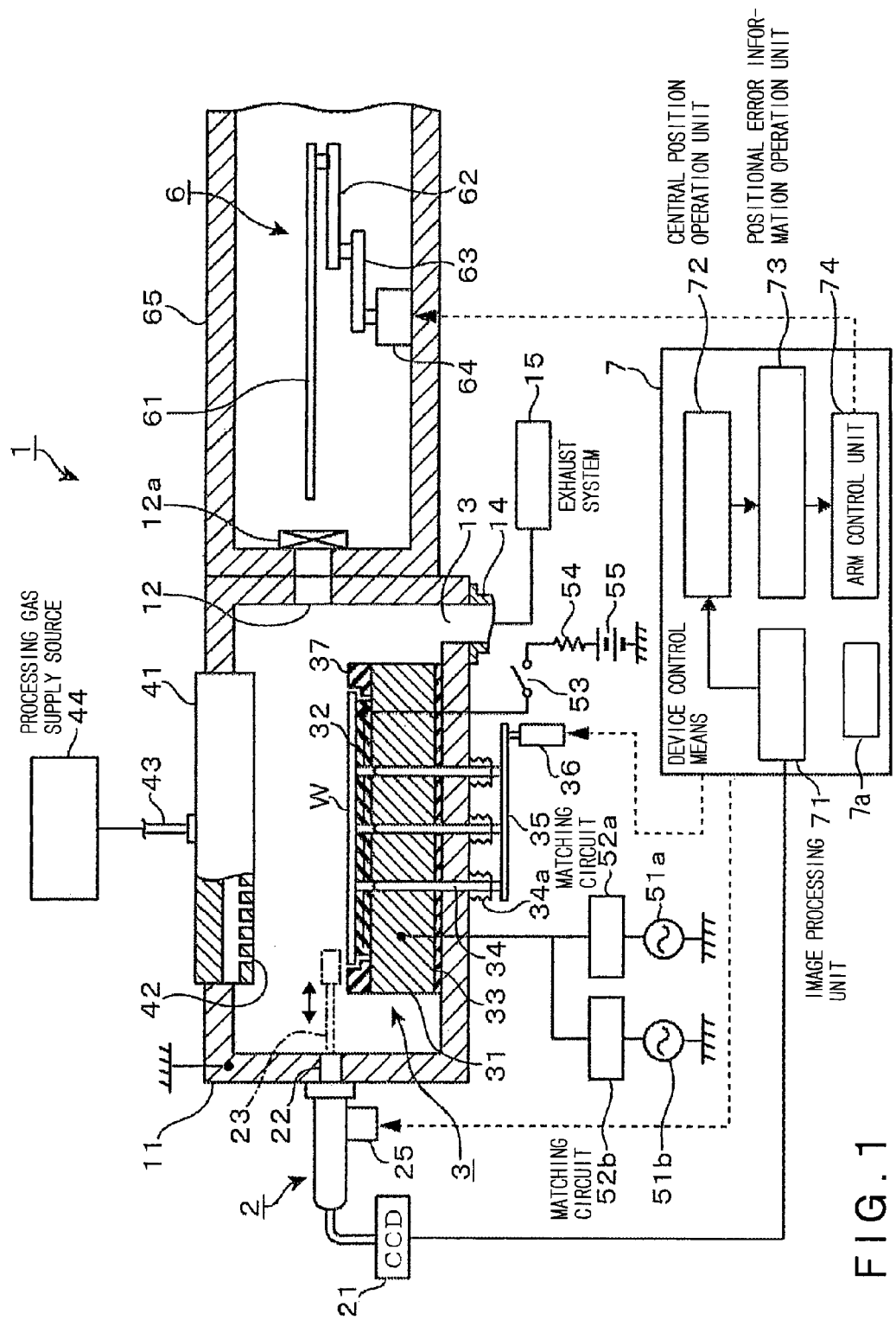
FIG. 1 is a longitudinal side view, showing one example of a plasma processing apparatus according to one embodiment of the present invention.

One embodiment, in which the present invention is applied to a plasma etching apparatus as a substrate processing apparatus, will be described below. FIG. 1 is one example of a plasma processing apparatus 1. The plasma processing apparatus 1 includes a processing vessel 11 formed of aluminum and used as, for example, a vacuum chamber, and a carrying apparatus 6 as a substrate carrying means, which is adapted to carry a wafer (substrate) W between the interior and the exterior of the processing vessel 11. In the interior of the processing vessel 11, a placing table 3 is provided to be located at a central position of a bottom wall of the processing vessel 11, and an upper electrode 41 is installed above the placing table 3 such that it is opposed to the placing table 3.

The processing vessel 11 has a contour of a generally rectangular parallelepiped shape, and an inner circumferential face of a circular shape, for example. In the bottom wall of the processing vessel 11, an exhaust port 13 is formed, and an exhaust system 15 comprising a vacuum pump is connected to the exhaust port 13 via an exhaust pipe 14. To the exhaust system 15, a pressure control section (not shown) is connected, which evacuates, with vacuum, the whole interior of the processing vessel 11, based on an instruction provided from a device control means 7 described below, so as to keep the interior of the processing vessel 11 at a desired level of vacuum. In a side wall of the processing vessel 11, a transfer port 12 is provided for transferring the wafer W, to be used as a substrate, therethrough. The transfer port 12 can be opened and closed by using a gate valve 12a. The processing vessel 11 is earthed.

Next, the placing table 3 will be described. The placing table 3 includes a lower electrode 31 for generating plasma, which is formed of, for example, a cylindrical aluminum, and an electrostatic chuck 32 provided on the lower electrode 31 and adapted to fix the wafer W thereto. The lower electrode 31 is fixed to the bottom wall of the processing vessel 11 via an insulation member 33, so as to be sufficiently floated or electrically insulated from the processing vessel 11.

The electrostatic chuck 32 is, for example, of a circular shape having a diameter less than the diameter of the wafer W, and has a 1 mm thickness. The electrostatic chuck 32 includes an upper dielectric layer, a lower electric layer, and an electrode film interposed between the upper dielectric layer and the lower dielectric layer. The electrode film in the electrostatic chuck 32 is connected with a high voltage direct current power source 55 via a switch 53 and a resistor 54. When high voltage direct current power is applied to the electrode film from the high voltage direct current power source 55, the wafer W is electrostatically chucked onto a placing face by coulomb force to be generated on the surface of the dielectric layers of the electrostatic chuck 32.

In the placing table 3, lifting pins 34 are provided, which serve as transfer means for transferring the wafer W to and from the carrying apparatus 6. Specifically, in the placing table 3, a plurality of, for example, three, lifting pins 34 are provided to extend through both the placing table 3 and the bottom wall of the processing vessel 11, and the bottom ends of these lifting pins 34 are supported by a supporting member 35, respectively. Bellows members 34a are provided to be interposed vertically between the supporting member 35 and the processing vessel 11 so as to secure airtightness in the processing vessel 11. The supporting member 35 can be raised and lowered by operation of a drive mechanism 36 comprising, for example, an air cylinder or ball screw mechanism.

Accordingly, distal ends of the lifting pins 34 can be projected from and retracted into holes formed in the surface of the placing table 3, due to operation of the drive mechanism 36, thereby transferring the wafer W between the carrying apparatus 6 and the placing face of the electrostatic chuck 32. As used herein, the term "correct placing position" is intended to mean a position in which the central position of the wafer W to be transferred onto the electrostatic chuck 32 is coincident with the central position of the electrostatic chuck 32 (i.e., placing table 3). As described above, since the diameter of the electrostatic chuck 32 is slightly smaller than the diameter of the wafer W, the wafer W will cover over the whole surface of the electrostatic chuck 32 in a state wherein the wafer W is placed thereon, with its periphery projected laterally outside.

In addition to the above elements, a coolant passage (now shown) for cooling the wafer W placed on the electrostatic chuck 32, through holes and gas passages (not shown) for discharging the back side gas in order to enhance heat conductivity between the placing table 3 and the rear face of the wafer W are provided in the placing table 3.

To the lower electrode 31, a first high frequency power source 51a for supplying high frequency electric power of, for example, a 100 MHz frequency, and a second high frequency power source 51b for supplying high frequency electric power of, for example, a 3.2 MHz frequency, which is lower than that of the first high frequency power source 51a, are connected via matching circuits 52a, 52b, respectively. The high frequency electric power supplied from the first high frequency power source 51a serves to change a processing gas, which will be described below, into plasma, and the high frequency electric power supplied from the second high frequency power source 51b serves to draw ions present in the plasma into the surface of the wafer W by applying bias electric power to the wafer W.

At an outer periphery of the top face of the lower electrode 31, a focus ring 37 is provided to surround the electrostatic chuck 32. The focus ring 37 serves to control the state of plasma in an outer region relative to the outer periphery of the wafer W as well as serves to enhance uniformity of the etching rate in the wafer surface, such as by extending the plasma outward relative to the wafer W.

Next, the upper electrode 41 will be described. The upper electrode 41 is formed into a hollow shape and includes a plurality of gas supplying holes 42 formed in its bottom face. For example, these gas supplying holes 42 serve to supply and disperse the processing gas into the processing vessel 11 and are arranged uniformly to provide a shower head. A gas introducing pipe 43 is provided at the middle portion of a top face of the upper electrode 41. The gas introducing pipe 43 extends through the middle portion of the top wall of the processing vessel 11, and is connected with a processing gas supply source 44 on the upstream side. The processing gas supply source 44 includes a control mechanism (not shown) for the supply amount of the processing gas, so that it can control to supply or stop the processing gas, and/or increase or decrease the supply amount of the processing gas, to the plasma processing apparatus 1.

With the configuration of the apparatus described above, in the interior of the processing vessel 11 of the plasma processing apparatus 1, a pair of parallel flat plate type electrodes are composed of the lower electrode 31 and the upper electrode 41. After controlling the interior of the processing vessel 11 to a predetermined level of vacuum, the processing gas is introduced, and high frequency electric power is then applied thereto from the first and second high frequency power sources 51a, 51b, thereby to change the processing gas into plasma (in a plasma state). During this process, high frequency electric current flows in a route defined in the order of: the lower electrode 31, the plasma, the upper electrode 41, the wall of the processing vessel 11, and the earth. With such operation of the plasma processing apparatus 1, etching due to plasma is performed to the wafer W fixed onto the placing table 3.

Figure 2:
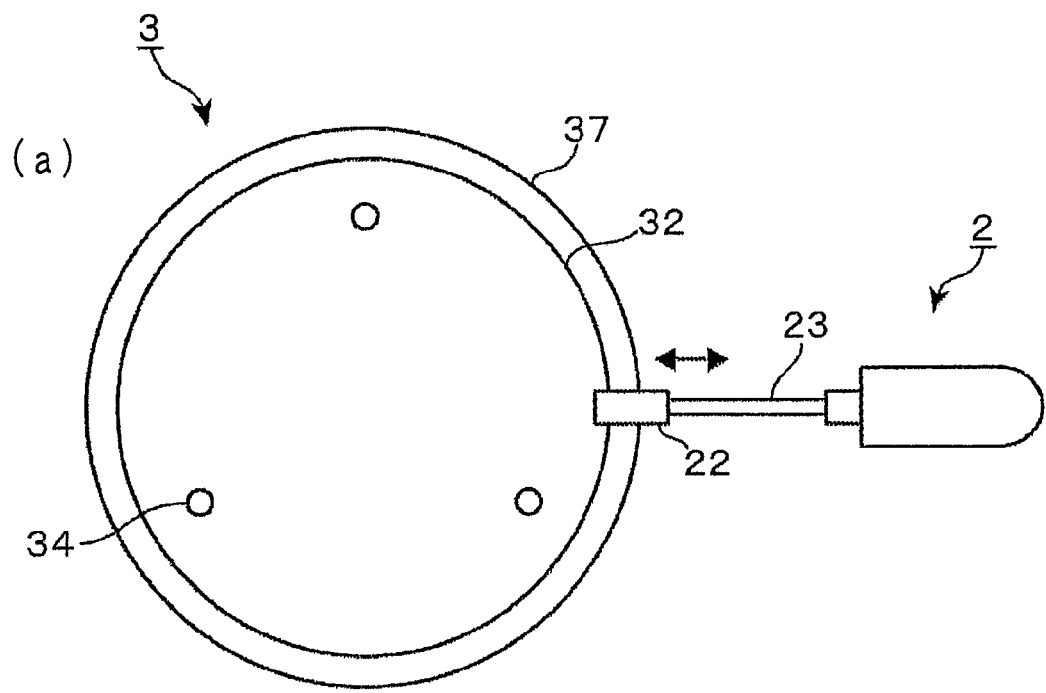
FIGS. 2(a) and 2(b) are plan views, respectively showing positional relationships between a placing table and a carrying apparatus, according to the embodiment described above.
Figure 2:
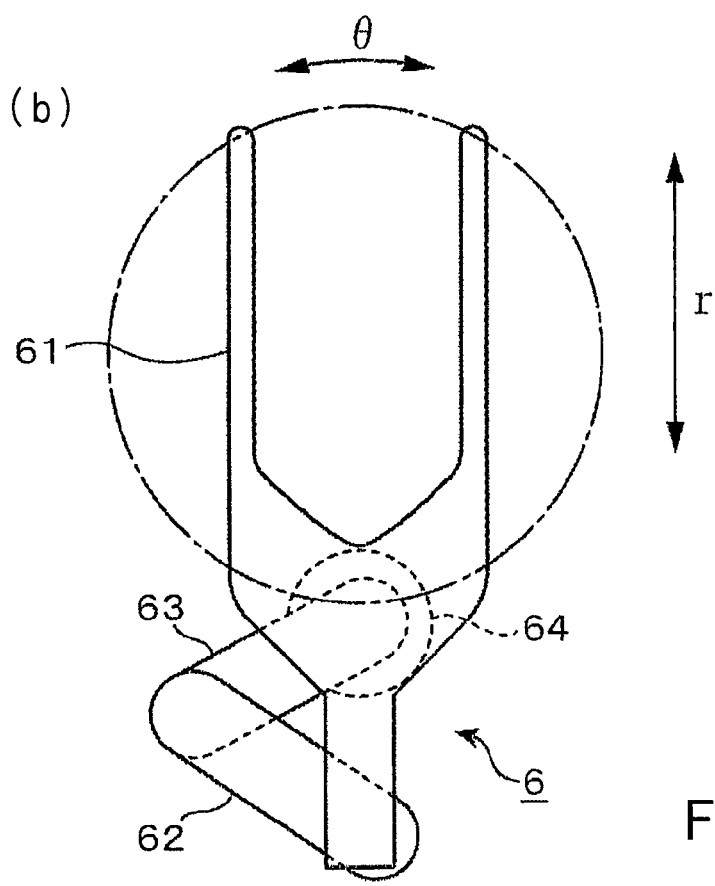

Next, the carrying apparatus 6 related to the above embodiment will be described. FIG. 2 is a plan view showing a positional relationship between the placing table 3 and the carrying apparatus 6. The carrying apparatus 6, for example, as shown in FIG. 1, which is housed in a housing 65, includes, a supporting table 64 fixed to a bottom wall of the housing 65, a first arm 63 connected with the supporting table 64 via a rotatable connecting shaft, and a second arm 62 and a fork 61. With such configuration, the carrying apparatus 6, as shown in FIG. 2, can carry optionally the wafer W, in a direction designated by θ in the drawing as well as in a direction designated by r, with the wafer W being placed on the distal fork 61. The carrying apparatus 6 is connected with the device control means 7 such that the carrying apparatus 6 can transfer the wafer W to the lifting pins 34 in the transferring position located above the placing position of the placing table 3, based on an instruction from the device control means 7.

Next, a detecting head 22 for optically detecting the periphery of the wafer W will be described. The detecting head 22 serves to optically detect the periphery of the wafer W or the like, in order to judge whether the wafer W held by the carrying apparatus 6 is correctly transferred to the transferring position located above the placing position of the placing table 3. In this embodiment, the optical detection of the periphery is carried out by obtaining image information of the periphery of the wafer W or the like.

Figure 3:
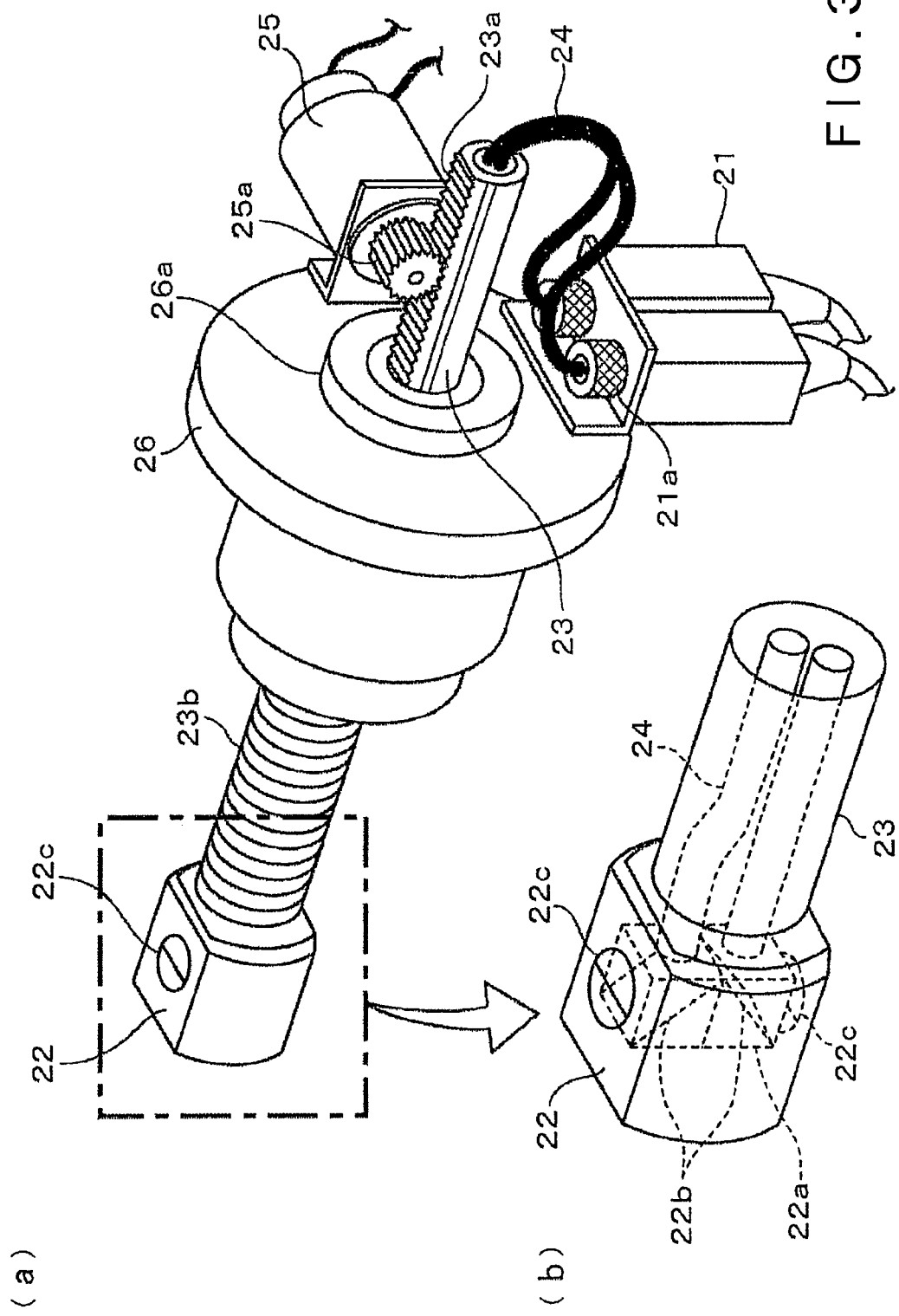
FIGS. 3(a) and 3(b) are perspective views, respectively showing examples of configuration of a detecting device according to the embodiment described above.

The detecting head 22 is attached to a distal end of a spline shaft 23, which extends though a wall of the processing vessel 11, as shown in FIG. 1. The detecting head 22 can be moved between a detection position for detecting the periphery of the wafer W or the like and an evacuation position, by movement of the spline shaft 23. FIG. 3(a) is a perspective view, illustrating an example of configuration of a detecting device 2 including the detecting head 22 and a driving section for driving the detecting head 22. Specifically, the detecting device 2 includes the detecting head 22 adapted to capture an image (or perform an optical detection), two CCD cameras 21 for outputting the captured image as an analog signal, and the spline shaft 23 incorporating an optical fiber adapted to connect the CCD cameras 21 to the detecting head 22.

The detecting head 22 has, for example, a casing of a box-like shape, as shown in an enlarged view of FIG. 3(b), and is connected with the spline shaft 23 at its bottom face. In the casing of the detecting head 22, a side view attachment 22a is contained, which is adapted to capture images in the upward and downward directions respectively. To the side view attachment 22a, two optical fibers 24 are connected. In addition, the side view attachment 22a includes two sheets of reflecting mirrors 22b, each of which is inclined at 45° relative to the upward and downward directions as defined in the detecting head 22 as well as to the direction in which the optical fibers 24 are connected. At top and bottom faces of the detecting head 22, windows 22c formed of glass are provided, respectively, such that images are captured in the upward and downward directions as defined in the detecting head 22 through these windows 22c and then come into the reflecting mirrors 22b, respectively.

The two CCD cameras 21 are connected with the optical fibers 24 via lenses 21a, respectively, such that these cameras 21 can obtain the images captured by the detecting head 22, via the optical fibers 24, respectively. Each CCD camera 21 has a function to convert the image obtained into image information comprising an electric analog signal and output it to the device control means 7 via an A/D converter which will be described below.

Next, the spline shaft 23 will be described. The spline shaft 23 is configured to contain the optical fibers therein as well as to move the detecting head 23 attached at its distal end, in left and right directions in the drawing. At a base portion of the spline shaft 23 depicted on the right side in the drawing, a rack gear 23a is provided along the transfer direction of the spline shaft 23. The rack gear 23a is meshed with a pinion gear 25a, and a rotating shaft of the pinion gear 25a is connected with a motor 25. The motor 25 is connected with the device control means 7 via a controller (not shown). With control of the direction and speed of rotation of the motor 25 due to the device control means 7, the detecting head 22 can be driven via the pinion gear 25a and the rack gear 23a.

The spline shaft 23 extends through approximately the central portion of a base flange 26 having a shape, for example, as shown in FIG. 3(a), and is configured to be supported by the base flange 26. The base flange 26 has a shape suitable for an outer frame of, for example, a viewing window, provided in advance in the processing vessel 11, whereby the detecting device 2 can be installed in the plasma processing apparatus 1, by fixing the base flange 26 to a place, at which the viewing window has been provided, after removal of the viewing window. Between the spline shaft 23 and the base flange 26, a linear spline 26a is provided, thereby to keep airtightness in the processing vessel 11 even in the case of moving the spline shaft 23. In the drawing, reference numeral 23b designates a bellows for covering the spline shaft 23 projecting out on the interior side of the processing vessel 11. The base portion of the spline shaft 23 and the motor 25 are covered with covering elements, as shown in FIG. 1.

As shown in FIG. 2, the detecting device 2 is attached to the processing vessel 11 such that the detecting head 22 is moved in a direction orthogonal to the directions in which the wafer W is carried in and carried out. However, in FIG. 1, the detecting device 2 is expressed, for convenience, to be located in a position opposite to the directions in which the wafer W is carried in and carried out.

Next, the device control means 7 will be described. The device control means 7, for example, comprises a computer having a program storage section (now shown), in which computer programs including operations of the plasma processing apparatus 1, i.e., a group of steps (instructions) concerning control related to operations for providing etching to the wafer W are stored. In accordance with the computer programs to be read out by the device control means 7, the device control means 7 controls the whole operations of the plasma processing apparatus 1. The computer programs are stored in the program storage section in a state wherein they are memorized in a memory means 7a, such as a hard disk, a compact disk, a magnet optical disk, a memory card and the like.

The device control means 7 also has a function as an calculation means and/or control means adapted to drive the detecting head 22 as well as to move the carrying apparatus 6 based on results of the optical detection (optical detection results) on the periphery of the wafer W and/or placing table 3, which are obtained from the detecting head 22. More specifically, the device control means 7, as shown in FIG. 1, has functions as an image processing unit 71, a central position operation unit 72, a positional error information operation unit 73 and an arm control unit 74.

The image processing unit 71 serves to provide an imaging process to the image information obtained from the CCD 21 and output the processed data to the central position operation unit 72. The central position operation unit 72 serves to obtain the central position of the wafer W and/or placing table 3 based on the image obtained from the image processing unit 71 and output the obtained positional information to the positional error information operation unit 73. The positional error information operation unit 73 is adapted to obtain an amount of a positional error and a direction of the positional error, between a current position of the wafer W and the position of the placing table 3 (i.e., the programmed position, in which the wafer W to be is transferred from the carrying apparatus 6 to the lifting pins 34, above the placing table 3), based on the information on the central position of the wafer W and/or placing table, obtained from the central position operation unit 72, and is adapted to output the obtained results to the arm control unit 74, as positional error information. The arm control unit 74 serves to correct the transferring position relative to the lifting pins 34, by moving the fork 61 of the carrying apparatus 6, such that the amount of the positional error between the current position of the wafer W and the programmed position previously described is set to be within an allowable range, based on the positional error information obtained from the positional error information operation unit 73.

Figure 4:
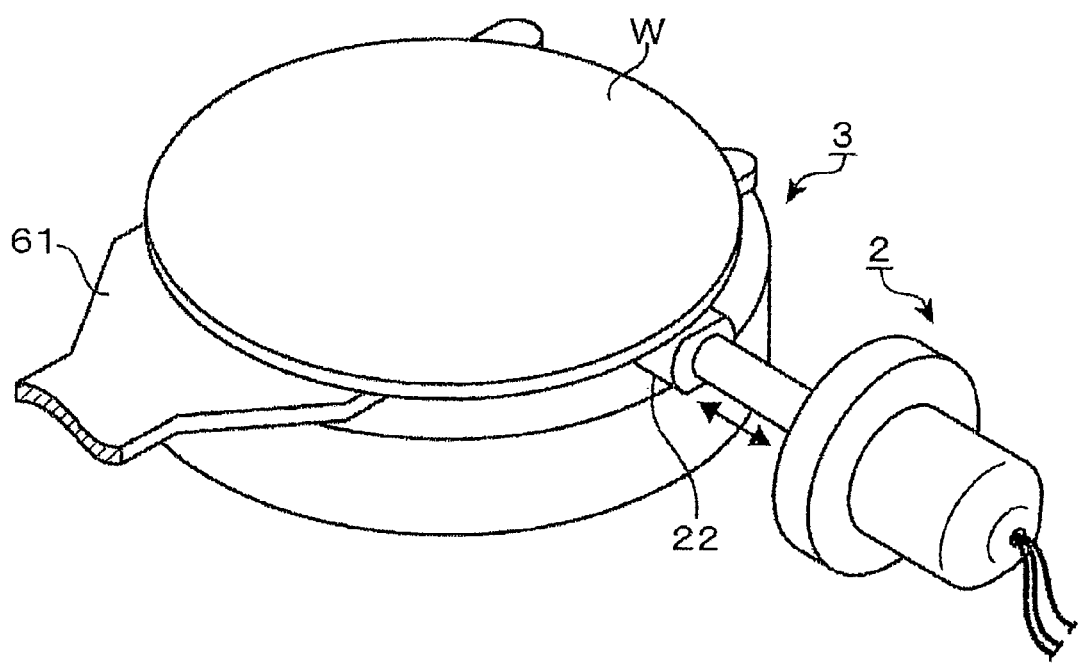
FIG. 4 is a perspective view, illustrating a positional relationship of a wafer and the periphery of a placing table when they are detected by a detecting head.

FIG. 4 is a perspective view, illustrating a positional relationship between the wafer W and the placing table, when the detecting head 22 obtains image information. Upon capturing image information by using the detecting head 22, the wafer W carried into the processing vessel 11 is stopped, while being held by the fork 61 (carrying apparatus 6), in a position approximately above the transferring position of the placing table 3. In this state, the detecting head 22 is inserted between the wafer W and the placing table 3, laterally to the direction in which the wafer has been carried in, so as to capture an image of the outer periphery of the wafer W and/or placing table 3 (electrostatic chuck 32) in the detection position.

Figure 5:
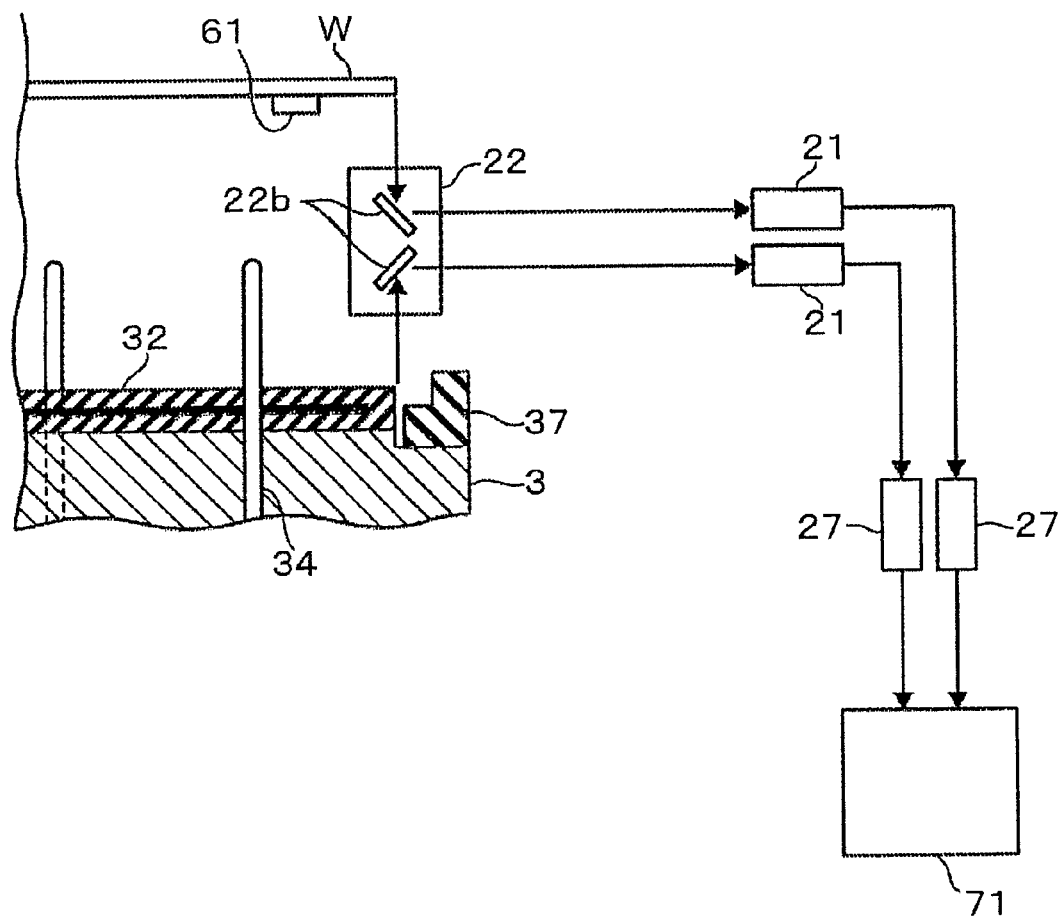
FIG. 5 is a view, showing optical paths along which CCD cameras obtain an image from the detecting head, and flows of image information outputted from the CCD cameras.

FIG. 5 is an illustration, showing optical paths along which the CCD cameras obtain images from the detecting head 22, and flows of image information outputted from the CCD cameras. The images coming into via the upper and lower windows 22c of the detecting head 22 are reflected by the reflecting mirrors 22b, and then come into the CCD cameras 21 through the optical fibers 24, respectively. These images are converted into analog signals in the CCD cameras 21 and then outputted to the A/D converter 27 as the image information, respectively. The A/D converter 27 is adapted to convert the image information comprising analog signals into digital signals suitable for a process to be performed by a computer or the like. The image information converted into 8-bit digital signals for enabling, for example, a 256 gradient display, in the A/D converter 27 is then inputted into the image processing unit 71 in the device control means 7.

As previously described, since the diameter of the wafer W is larger than the diameter of the electrostatic chuck 32 located at the upper portion of the placing table 3, images of the respective outer peripheries are obtained, in fact, by moving the detecting head 22 as described below. However, for convenience, FIG. 5 is depicted such that images of the outer peripheries of the wafer W and placing table 3 are captured in the same position.

Figure 6:
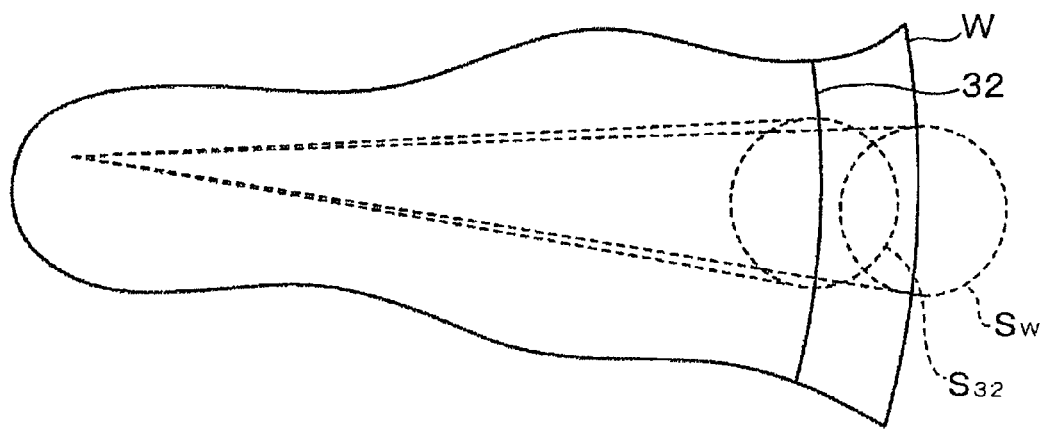
FIGS. 6(a) and 6(b) are views, for respectively describing methods for obtaining the central position of a wafer or the like by using the detecting head.
Figure 6:
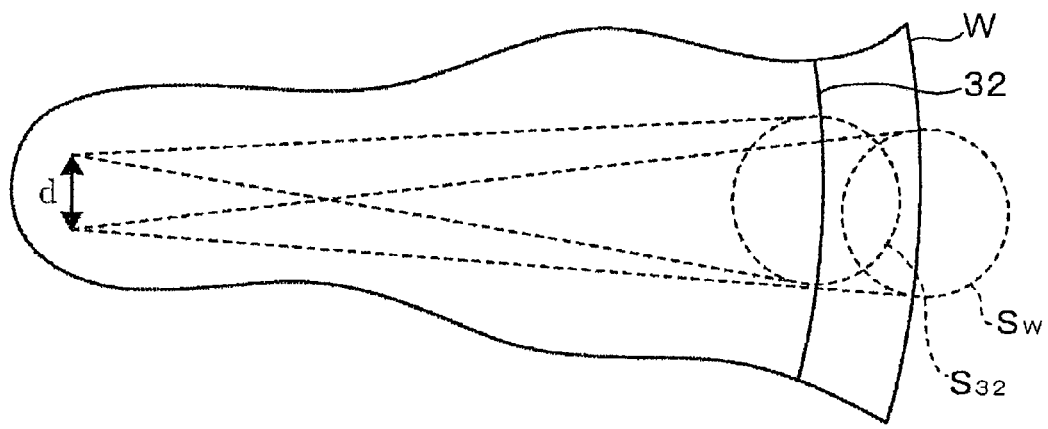

FIG. 6 is a schematic view for explaining a principle for obtaining the respective central positions of the wafer W and placing table 3 (electrostatic chuck 32), by using the central position operation unit 72, based on the image information obtained by the detecting head 22. FIG. 6($a$) is an illustration showing a case wherein the central position of the wafer W is coincident with the central position of the electrostatic chuck 32. In FIG. 6($a$), a region SW surrounded by a dashed line designates a photographed region of an image of the wafer W to be captured from the window 22c located at the upper face of the detecting head 22, while a region S32 designates a photographed region of an image of the electrostatic chuck 32 to be captured from the window 22c located at the lower face. A first detection position in which the image of the region SW is captured and a second detection position in which the image of the region S32 is captured are stored, in advance, in a storage means located in the device control means 7. Based on the information, the device control means 7 rotates the motor 25 in a predetermined amount, so as to move the detecting head 22 to the respective detection positions, as such obtaining the image information for the regions SW, S32.

Next, a method of obtaining the central positions of the wafer W and electrostatic chuck 32 based on the image information obtained will be described. For example, with respect to the region SW of the wafer W, the image processing unit 71 identifies the contour of the wafer W crossing the region SW, based on, for example, gradient differences in the image information obtained, and outputs the results to the central position operation unit 72. In this case, since the wafer W is of a substantially circular shape, the shape of the contour of the wafer W crossing the region SW is captured as a circular arc. The central position operation unit 72 performs an operation for drawing perpendicular lines, from both ends of the circular arc crossing the region SW to the center of the wafer W. Thus, the central position operation unit 72 identifies the point of intersection of the two perpendicular lines drawn from the both ends of the circular arc to the center as the central position of the wafer W, and then outputs the positional information to the positional error information operation unit 73. The central position operation unit 72 also identifies the central position of the electrostatic chuck 32 (placing table 3) in the same manner.

The positional error operation unit 73 obtains an amount of a positional error and a direction of the positional error of the central position, based on the positional information on the central positions of the wafer W and electrostatic chuck 3 obtained from the central position operation unit 72. Then, it outputs the newly obtained information to the arm control unit 74, as the positional error information between the current position of the wafer W and the programmed position in which the transfer is to be carried out. Specifically, for example, coordinates of the central position of the wafer W and of the central position of the placing table 3 (electrostatic chuck 32) are obtained, on the assumption that the center of rotation of the carrying apparatus 6 is the origin of the polar coordinate system (r, θ), and an amount of shift in the coordinates is expressed by using r and θ, and the result is then outputted as the positional error information.

The arm control unit 74 also compares the amount of the positional error included in the so-obtained positional information with an allowable range. Specifically, the arm control unit 74 judges whether the distance between the two central positions is within the allowable range or not. As a result, if the central positions are consistent with each other, the arm control unit 74 outputs an instruction to the carrying apparatus 6 to transfer the wafer W to the electrostatic chuck 32 without any positional adjustment for the wafer W. In this embodiment, the allowable range is set at 0.1 mm, and if the amount of the positional error is within the allowable range, the current position of the wafer W and the programmed position are judged to be consistent with each other.

FIG. 6(*b*) is an illustration showing a case in which the central positions of the wafer W and electrostatic chuck 32 are shifted from each other. If the amount (expressed by "d" in the drawing) of the positional error between these central positions is greater than 0.1 mm, the arm control unit 74 outputs an instruction to the carrying apparatus 6 to correct the position in which the wafer W is held, such that the amount of the positional error will be within 0.1 mm (in the allowable range). Consequently, the carrying apparatus 6 is controlled to take its carrying position, based on the polar coordinate system (r, θ), and to move to eliminate the amount of the positional error between the two central positions, so as to make the respective centers of the wafer W and electrostatic chuck 32 consistent with each other. Upon completion of the correction, the transfer of the wafer W is carried out in the so-corrected position. However, prior to carrying out the transfer, the peripheries of the wafer W and electrostatic chuck 32 may be detected again in order to further confirm whether the central positions coincide with each other.

Figure 7:
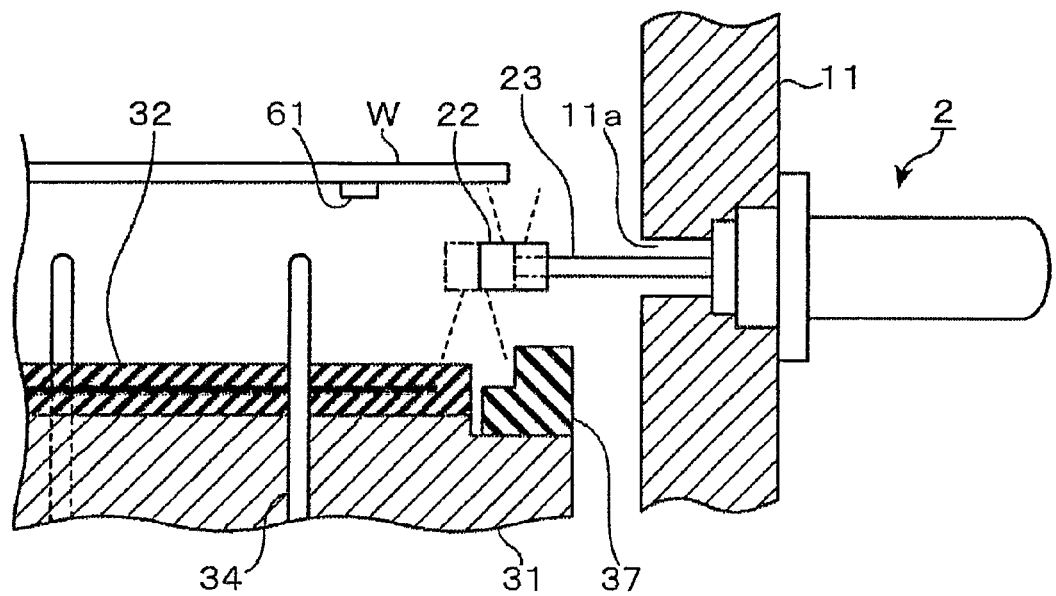
FIGS. 7(a) and 7(b) are views, for respectively describing operation of a plasma processing apparatus according to the embodiment above.
Figure 7:
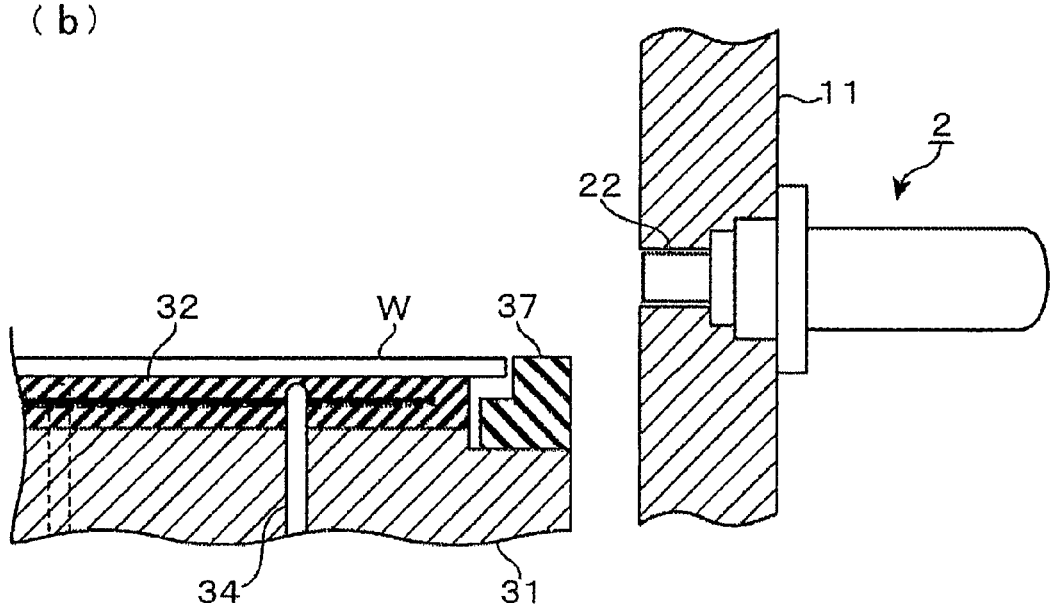

Next, operation of the plasma processing apparatus 1 related to this embodiment will be described. FIG. 7(*a*) is an illustration showing a state in the processing vessel 11 just prior to the transfer of the wafer W, which has been carried therein, to the placing table 3. In the operation before reaching such a state, the device control means 7 initially controls the detecting head 22 to wait to be evacuated in its evacuation position, which will be described below. Thereafter, the gate valve 12*a* is actuated to open the transfer port 12, and the carrying apparatus 6, which has waited while holding the wafer W on its fork 61, is then moved to carry the wafer W up to a position above the transferring position on the placing table 3. Subsequently, the device control means 7 drives the motor 25 to move the detecting head 22 to the first detection position so as to obtain the image information of the region SW from the windows 22*c*. The detecting head 22 in the first detection position is shown by a solid line in FIG. 7(*a*). Thereafter, the motor 25 is actuated again to move the detecting head 22 to the second detection position so as to obtain the image information of the region S32 from the windows 22*c*. In this case, the detecting head 22 in the second detection position is shown by a dashed line in FIG. 7(*a*). After obtaining the image information in these detection positions, respectively, the device control means 7 drives the detecting head 22 to be evacuated into the evacuation position.

The device control means 7 judges whether there is a need for correcting the holding position of the wafer W or not, based on the obtained positional error information as previously described, with respect to the central position of the wafer W and the central position of the electrostatic chuck 32. If there is no need for the correction, the wafer W is transferred from the carrying apparatus 6 to the placing table 3 via the lifting pins 34 without any positional adjustment for the wafer W, and the switch 53 is turned ON to drive the electrostatic chuck 32 to electrostatially chuck the wafer W. Thereafter, an etching process is started. However, if there is a need for the positional correction of the wafer W, the device control means 7 outputs an instruction to the carrying apparatus 6 to correct the position in which the wafer W is held, so as to eliminate the positional error between the center of the wafer W and the center of the electrostatic chuck 32, as previously described. Once the holding position of the wafer W has been corrected, the wafer W is transferred from the carrying apparatus 6 to the placing table 3, in that corrected position, and the etching process is then started.

FIG. 7(*b*) is an illustration showing a state in the processing vessel 11 after the wafer W has been placed on the placing table 3. As previously described, the device control means 7 drives the detecting head 22 to move in the opposite direction to the case of moving it to the detection position, thereby to evacuate the detecting head 22 into the evacuation position before the wafer W is placed on the placing table 3. Once the detecting head 22 has reached a recess 11*a* provided in the wall of the processing vessel 11, the travel of the detecting head 22 is stopped. The recess 11*a* has a space corresponding to the shape of the detecting head 22, and as shown in FIG. 7(*b*), it is configured such that the detecting head 22 can be housed in the evacuation position with substantially no gap being formed therebetween (or with a gap formed to an extent for enabling the detecting head 22 to be projected out and inserted in). Namely, in a state wherein the detecting head 22 is received in the recess 11*a*, the surface of the detecting head 22 becomes a part of the wall face of the processing vessel 11. In this way, since the detecting head 22 is evacuated up to the position getting out of or spaced away from the transfer region where the transfer of the wafer W is carried out, the wafer W can be transferred from the carrying apparatus 6 to the placing table 3 without any interference due to the detecting head 22.

The etching process is carried out by keeping the internal space of the processing vessel 11 at a predetermined level of vacuum, supplying the processing gas into the processing vessel 11 via the shower head, and generating a high frequency electric field between the shower head (upper electrode 41) and the placing table 3 (lower electrode 41) so as to change the processing gas into plasma, thereby to etch the surface of the wafer W by utilizing the plasma. After the etching process, the switch 53 is turned OFF so as to release the chucking force generated by the electrostatic chuck 32, the wafer W is then transferred to the carrying apparatus 6 via the lifting pins 34, and thereafter the wafer W is carried out of the processing vessel.

According to this embodiment, both of the current position in which the wafer W is held by the carrying apparatus 6, and the position of the placing table 3 (i.e., the programmed position in which the transfer of the wafer W is to be carried out) are detected optically by the detecting head 22, so as to correct the transferring position of the wafer W, based on the results, by using the carrying apparatus 6. Therefore, even though the placing table is bent or deformed, the wafer W can be placed on the transferring position more accurately, as compared with, for example, the plasma processing apparatus of such a type that only the position of the wafer W is detected by using the detecting head fixed to the wall of the processing vessel.

Since the detecting head 22 is evacuated from the detection position into the evacuation position when the detection is not carried out, the detecting head 22 does not interfere with the mounting operation of the wafer W onto the placing table. Since the detecting head 22 is evacuated from the processing space during the etching operation, inconvenience, such as degradation of uniformity in the etched surface to be caused by existence of the detecting head in the processing vessel which may have adverse effect to the plasma, is not likely to occur, as compared with, for example, the case in which the detecting head is embedded in the placing table 3.

Additionally, since the transferring position of the wafer W is corrected based on the positional error information between the current position of the wafer W and the programmed position in which the transfer is to be carried out so as to place the wafer W in the corrected placing position, abnormal operations, for example, in the case where the wafer W would ride on the focus ring 37 or the like provided in the periphery of the placing table 3, can be avoided. Furthermore, it is unlikely that the placing table 3 would be damaged by exposure of the plasma, since the wafer W is carried to an incorrect transferring position. Thus, maintenance cost for the apparatus can be saved.

Since the outer periphery of the placing table 3 is also detected, more accurate positioning of the wafer W can be achieved, taking into consideration factors, such as deformation of the placing table 3 per se.

When the detecting head 22 can be installed in the processing vessel 11, by fixing it to a place, at which a viewing window has been provided, after removal of the viewing window, an existing plasma processing apparatus 1 can be applied by employing the so-called retrofit. In such a case, since the detecting head 22 can be attached only by removing the existing viewing window, this application requires less reconstruction and is hence more advantageous in the cost, as compared with the type that the detecting head is embedded in the placing table 3.

In addition to the correction of the transferring position of the wafer W by using the carrying apparatus 6, a warning means may be further provided, which is adapted to issue a warning when the amount of the positional error described above exceeds the allowable range. In this case, since the operator can take a required action immediately after noticing the warning or the plasma processing apparatus 1 is stopped automatically based on the warning, breakage or damage on the wafer W and/or relating members can be prevented, to minimize the loss. Furthermore, the system may be configured such that the transferring operation of the wafer W from the carrying apparatus 6 to the placing table 3 can be stopped automatically.

In this embodiment, the positional error information between the central position of the wafer W and the central position of the electrostatic chuck 32 may be obtained, after detaching the wafer W from the electrostatic chuck 32 due to the lifting pins 34 and then driving the detecting head 22 to be advanced into a space between the wafer W and the electrostatic chuck 32, following the completion of the etching. However, there still remains a possibility of the so-called de-chucking error. In this case, the electrostatic chuck 32 may still hold the wafer W, due to a remaining electric charge, even after release of application of the direct current electric voltage thereto, and wherein the wafer W may thus leap upward or be raised up obliquely, if it is pushed up with a great raising force by the lifting pins 34. To address such a situation, the detection of the amount of the positional error due to the detecting head 22 can be also utilized to detect the de-chucking error. Namely, additional programs may be incorporated into the respective programs provided in the device control means 7 and a warning means may be provided thereto, such that the carrying apparatus 6 can be stopped automatically and a warning can be issued at the same time, if the amount of the positional error would exceed a predetermined range (e.g., 10 mm).

In this case, if the positional error information is out of the allowable range (e.g., 0.1 mm) while it is within the predetermined range described above, the receiving position (i.e., the transferring position from the lifting pins 34 to the carrying apparatus 6) of the wafer W is corrected by the carrying apparatus 6. The receiving position of the wafer W with respect to the carrying apparatus 6 has been determined by a set-up operation prior to the starting up of the plasma processing apparatus 1. The wafer W, in this case, will be received by shifting the position of the fork 61 of the carrying apparatus 6, by the amount of the positional error described above, relative to the predetermined position.

Figure 8:
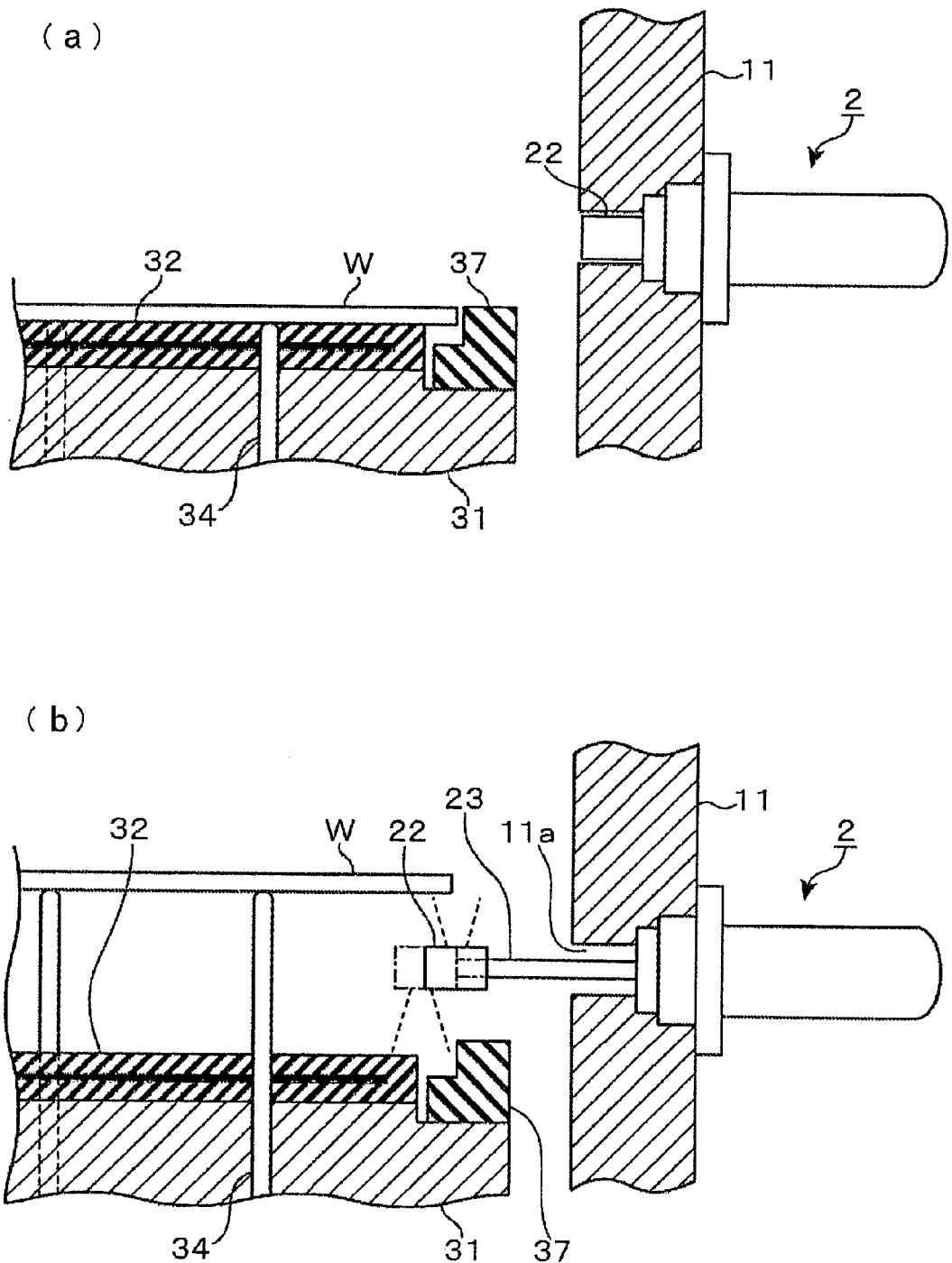
FIGS. 8(a) and 8(b) are views, for respectively describing operation of a plasma processing apparatus according to another embodiment.

FIG. 8 is an illustration for describing operation of the plasma processing apparatus 1 related to the above embodiment. FIG. 8(*a*) is an illustration showing a state in the processing vessel 11, with the wafer W being subjected to the etching process. During the performance of the etching process, as is similar to the case described with reference to FIG. 7(*b*), the device control means 7 evacuates the detecting head 22 into the evacuation position. As described with reference to FIG. 1, the wafer W is electrostatically chucked by the placing face on the electrostatic chuck 32. At this time, the lifting pins 34 are retracted in the lower electrode 31.

Upon completion of the etching process to the wafer W, the gate valve 12*a* is opened, and the carrying apparatus 6 is moved from the exterior into the processing vessel 11 in order to carry out the etched wafer W. The device control means 7 stops the supply of the high voltage direct electric current from the high voltage direct current power source 55 to the electrostatic chuck 32 in order to de-chuck or release the electrostatic chucking to the wafer W, and simultaneously it raises the lifting pins 34 to lift up the wafer W for preparation of the transfer of the wafer W to the carrying apparatus 6.

FIG. 8(*b*) is an illustration showing a state in the processing vessel 11, immediately after the wafer W is raised by the lifting pins 34. After the wafer W is raised, the device control means 7 moves the detecting head 22 into a space between the wafer W and the electrostatic chuck 32 so as to obtain the image information of the region SW and the image information of the region S32 in the first and second detection positions, respectively. Thereafter, the device control means 7 evacuates the detecting head 22 into the evacuation position. In FIG. 8(*b*), the detecting head 22 located in the first detection position is shown by a solid line, and the detecting head 22 located in the second detection position is shown by a dashed line.

Thereafter, the device control means 7 judges whether there is a need for correcting the transferring position in which the wafer W is transferred from the lifting pins 34 to the carrying apparatus 6, based on the obtained positional error information between the central position of the wafer W and the central position of the electrostatic chuck 32. If there is no need for the correction, the wafer W is transferred from the placing table 3 to the carrying apparatus 6, without any positional adjustment for the wafer W, so as to carry out the wafer W. On the other hand, if there is a need for the correction, the device control means 7 further judges whether the transfer of the wafer W to the carrying apparatus 6 is possible or not, after having corrected the transferring position. As are result, if it judges that the transfer is not possible, the carrying apparatus 6 is stopped automatically, and a warning for noticing generation of abnormality is outputted by using sounds or displaying the warning on an operation screen.

According to this embodiment, even in the case where the position of the wafer W is shifted from the desired position, such as by raising the wafer W due to the lifting pins 34 upon the de-chucking error, the wafer W can be transferred correctly from the placing table 3 to the carrying apparatus 6, due to the correction of the transferring position as described above. Consequently, the carrying apparatus 6, which has received the wafer W, can carry the wafer W into a correct position of a next unit for receiving the wafer W therein.

Even in the case where the receiving position can not be corrected by the carrying apparatus 6 because of an excessive amount of the positional error of the wafer W caused by the de-chucking error, since the operation of the carrying apparatus 6 can be stopped automatically, damages on the wafer W and instruments of interest, due to abnormal contact between the wafer W and the carrying apparatus 6, can be prevented. In addition, since generation of such abnormality can be noticed by sounds or screen displays, an operator can immediately take a necessary action based on the warning. Thus, the period of time necessary for stopping the plasma processing apparatus 1 can be reduced.

In the description above, the present invention is not limited to the detection of the outer periphery of the placing table 3 by the detecting head 22, but the central position of the placing table 3 may be used as fixed positional information. While a case in which the substrate processing apparatus according to the present invention is applied to a plasma etching apparatus has been described, the substrate processing apparatus to which the present invention can be applied is not limited to this aspect. For example, the present invention may be applied to a CVD apparatus or a cleaning apparatus. The measure for fixing the wafer W to the placing table 3 is not limited to the electrostatic chuck, but it may be, for example, a mechanical chuck adapted to press down a peripheral portion of the wafer W by using a ring member. In the embodiment described above, the detecting section 22 performs the detecting operations and the correcting operations for the transferring position, before the wafer W is placed on the placing table as well as when the wafer W is detached from the placing table. The present invention is not limited to this aspect. These operations may be performed at either one of these timings.

The invention claimed is:

1. A substrate processing apparatus, comprising:
   a processing vessel;
   a placing table provided in the processing vessel;
   a substrate carrying means to carry a substrate between the interior and the exterior of the processing vessel;
   a transfer means provided in the placing table, such that it can be raised from the placing table and lowered to the placing table to receive the substrate from the substrate carrying means and to put the substrate on the placing table;
   a detecting head to optically detect the outer periphery of the substrate carried by the substrate carrying means located in a substrate transferring position above the transfer means;
   a driving means provided on the inner wall of the processing vessel to move the detecting head between a detection position in which the outer periphery of the substrate is detected and an evacuation position which is spaced away from a substrate transferring region;
   a calculation means to obtain positional error information comprising, an amount of a positional error and a direction of the positional error between a current position of the substrate and a programmed position of the substrate, based on detection results from the detecting head; and
   a control means to correct a substrate transferring position of the substrate above the transfer means, by operating the substrate carrying means, such that the amount of the positional error between the current position of the substrate and the programmed position of the substrate is within an allowable range, based on the positional error information from the calculation means.

2. The substrate processing apparatus according to claim 1, further comprising a warning means to issue a warning when the amount of the positional error between the current position of the substrate and the programmed position of the substrate is out of the allowable range.

3. A substrate processing apparatus, comprising:
   a processing vessel;
   a placing table provided in the processing vessel;
   a substrate carrying means to carry a substrate between the interior and the exterior of the processing vessel;
   a transfer means provided in the placing table, such that it can be raised from the placing table and lowered to the placing table to receive the substrate from the substrate carrying means and to put the substrate on the placing table;
   a detecting head to optically detect the outer periphery of the substrate carried by the substrate carrying means located in a substrate transferring position above the transfer means;
   a driving means provided on the inner wall of the processing vessel to move the detecting head between a detection position in which the outer periphery of the substrate is detected and an evacuation position which is spaced away from a substrate transferring region;
   a calculation means to obtain positional error information comprising, an amount of a positional error and a direction of the positional error between a current position of the substrate and a programmed position of the substrate, based on detection results from the detecting head; and
   a warning means to issue a warning when the amount of the positional error between the current position of the substrate and the programmed position of the substrate is out of an allowable range, based on the positional error information from the calculation means.

4. The substrate processing apparatus according to claim 3, wherein the detecting head optically detects the outer periphery of the substrate.

5. The substrate processing apparatus according to claim 3 or 4, wherein the placing table includes an electrostatic chuck.

6. The substrate processing apparatus according to claim 1 or 3,
   wherein the detecting head optically detects the outer periphery of the substrate and the outer periphery of the placing table, and
   wherein the calculation means obtains a central position of the substrate based on the detection results for the outer periphery of the substrate and obtains a central position of the placing table based on the detection results for the outer periphery of the placing table, so as to obtain the positional error information comprising the amount of a positional error and the direction of the positional error.

7. The substrate processing apparatus according to claim 1 or 3, wherein the detection position of the detecting head is located between the substrate and the placing table.

8. The substrate processing apparatus according to claim 1 or 3, wherein the detecting head is housed in a wall portion of the processing vessel when it is in the evacuation position.

9. A substrate processing method for performing a process to a substrate, in a substrate processing apparatus, the substrate processing apparatus including:
   a processing vessel;
   a placing table provided in the processing vessel;
   a substrate carrying means to carry the substrate between the interior and the exterior of the processing vessel; and a transfer means provided in the placing table, such that it can be raised from the placing table and lowered to the placing table to receive the substrate from the substrate carrying means and to put the substrate on the placing table, wherein the method comprises the steps of:

moving a detecting head to a detection position, the detecting head detecting an outer periphery of the substrate carried by the substrate carrying means;

optically detecting the outer periphery of the substrate located in a substrate transferring position above the transfer means, by using the detecting head;

moving the detecting head to an evacuation position spaced away from a substrate transferring region, by using a driving means;

obtaining positional error information comprising, an amount of a positional error and a direction of the positional error between a current position of the substrate and a programmed position of the substrate, by using an calculation means, based on detection results from the detecting head; and correcting a substrate transferring position, by operating the substrate carrying means by using a control means, such that the amount of the positional error between the current position of the substrate and the programmed position of the substrate is within an allowable range, based on the positional error information from the calculation means.

10. The substrate processing method according to claim 9, further comprising the step of issuing a warning when the amount of the positional error between the current position of the substrate and the programmed position of the substrate is out of the allowable range.

11. A substrate processing method for performing a process to a substrate, in a substrate processing apparatus, the substrate processing apparatus including:

a processing vessel;

a placing table provided in the processing vessel;

a substrate carrying means to carry the substrate between the interior and the exterior of the processing vessel; and a transfer means provided in the placing table, such that it can be raised from the placing table and lowered to the placing table to receive the substrate from the substrate carrying means and to put the substrate on the placing table, wherein the method comprises the steps of:

moving a detecting head to a detection position, the detecting head detecting an outer periphery of the substrate carried by the substrate carrying means;

optically detecting the outer periphery of the substrate located in a substrate transferring position above the transfer means, by using the detecting head;

moving the detecting head to an evacuation position spaced away from a substrate transferring region, by using a driving means;

obtaining positional error information comprising, an amount of a positional error and a direction of the positional error between a current position of the substrate and a programmed position of the substrate, by using a calculation means, based on detection results from the detecting head; and issuing a warning when the amount of the positional error between the current position of the substrate and the programmed position of the substrate is out of the allowable range, based on the positional error information from the calculation means.

12. The substrate processing method according to claim 9 or 11, further comprising the step of carrying the substrate to a transferring position above the transfer means, from the exterior of the processing vessel, by using the substrate carrying means, before the detecting head is moved to the detection position.

13. The substrate processing method according to claim 9 or 11, further comprising the step of moving the substrate placed on the placing table to a transferring position above the transfer means, by raising the transfer means in the processing vessel, before the detecting head is moved to the detection position.

14. The substrate processing method according to claim 9 or 11, wherein the placing table includes an electrostatic chuck.

15. The substrate processing method according to claim 9 or 11, wherein the detecting head optically detects the outer periphery of the substrate carried by the substrate carrying means as well as the outer periphery of the placing table, and wherein the step of obtaining the positional error information by using the calculation means includes obtaining a central position of the substrate based on the detection results for the outer periphery of the substrate and obtaining a central position of the placing table based on the detection results for the outer periphery of the placing table, so as to obtain positional error information comprising, the amount of a positional error and the direction of the positional error between the current position of the substrate and the programmed position of the substrate.

16. The substrate processing method according to claim 9 or 11, wherein the detection position of the detecting head is located between the substrate and the placing table.

17. The substrate processing method according to claim 9 or 11, wherein the detecting head is housed in a wall portion of the processing vessel when it is in the evacuation position.

18. A computer program for executing a substrate processing method by using a computer, wherein the substrate processing method is for use in performing a process to a substrate, in a substrate processing apparatus, the substrate processing apparatus including:

a processing vessel;

a placing table provided in the processing vessel;

a substrate carrying means to carry the substrate between the interior and the exterior of the processing vessel; and a transfer means provided in the placing table, such that it can be raised from the placing table and lowered to the placing table to receive the substrate from the substrate carrying means and to put the substrate on the placing table, and wherein the substrate processing method comprises the steps of:

moving a detecting head to a detection position, the detecting means detecting an outer periphery of the substrate carried by the substrate carrying means;

optically detecting the outer periphery of the substrate located in a substrate transferring position above the transfer means, by using the detecting head;

moving the detecting head to an evacuation position spaced away from a substrate transferring region, by using a driving means;

obtaining positional error information comprising, an amount of a positional error and a direction of the positional error between a current position of the substrate and a programmed position of the substrate, by using an calculation means, based on detection results from the detecting head; and correcting a substrate transferring position, by operating the substrate carrying means by using a control means, such that the amount of the positional error between the current position of the substrate and the programmed position of the substrate is within an allowable range, based on the positional error information from the calculation means.

19. A computer program for executing a substrate processing method by using a computer, wherein the substrate processing method is for use in performing a process to a substrate, in a substrate processing apparatus, the substrate processing apparatus including:

a processing vessel;

a placing table provided in the processing vessel;

a substrate carrying means to carry the substrate between the interior and the exterior of the processing vessel; and a transfer means provided in the placing table, such that it can be raised from the placing table and lowered to the placing table to receive the substrate from the substrate carrying means and to put the substrate on the placing table, and wherein the substrate processing method comprises the steps of:

moving a detecting head to a detection position, the detecting means detecting an outer periphery of the substrate carried by the substrate carrying means;

optically detecting the outer periphery of the substrate located in a substrate transferring position above the transfer means, by using the detecting head;

moving the detecting head to an evacuation position spaced away from a substrate transferring region, by using a driving means;

obtaining positional error information comprising, an amount of a positional error and a direction of the positional error between a current position of the substrate and a programmed position of the substrate, by using an calculation means, based on detection results from the detecting head; and issuing a warning when the amount of the positional error between the current position of the substrate and the programmed position of the substrate is out of the allowable range, based on the positional error information from the calculation means.

20. A storage medium storing a computer program for executing a substrate processing method by using a computer, wherein the substrate processing method is for use in performing a process to a substrate, in a substrate processing apparatus, the substrate processing apparatus including:

a processing vessel;

a placing table provided in the processing vessel;

a substrate carrying means to carry the substrate between the interior and the exterior of the processing vessel; and a transfer means provided in placing table, such that it can be raised from the placing table and lowered to the placing table to receive the substrate from the substrate carrying means and to put the substrate on the placing table, and wherein the substrate processing method comprises the steps of:

moving a detecting head to a detection position, the detecting means detecting an outer periphery of the substrate carried by the substrate carrying means;

optically detecting the outer periphery of the substrate located in a substrate transferring position above the transfer means, by using the detecting head;

moving the detecting head to an evacuation position spaced away from a substrate transferring region, by using a driving means;

obtaining positional error information comprising, an amount of a positional error and a direction of the positional error between a current position of the substrate and a programmed position for the substrate, by using an calculation means, based on detection results from the detecting head; and correcting the substrate transferring position, by operating the substrate carrying means by using a control means, such that the amount of the positional error between the current position of the substrate and the programmed position is within an allowable range, based on the positional error information to be obtained from the calculation means.

21. A storage medium storing a computer program for executing a substrate processing method by using a computer, wherein the substrate processing method is for use in performing a process to a substrate, in a substrate processing apparatus, the substrate processing apparatus including:

a processing vessel;

a placing table provided in the processing vessel;

a substrate carrying means to carry the substrate between the interior and the exterior of the processing vessel; and a transfer means provided in the placing table, such that it can be raised from the placing table and lowered to the placing table to receive the substrate from the substrate carrying means and to put the substrate on the placing table, and wherein the substrate processing method comprises the steps of:

moving a detecting head to a detection position, the detecting means detecting an outer periphery of the substrate carried by the substrate carrying means;

optically detecting the outer periphery of the substrate located in a substrate transferring position above the transfer means, by using the detecting head;

moving the detecting head to an evacuation position spaced away from the substrate transferring region, by using a driving means;

obtaining positional error information comprising, an amount of a positional error and a direction of the positional error between a current position of the substrate and a programmed position of the substrate, by using an calculation means, based on detection results from the detecting head; and issuing a warning when the amount of the positional error between the current position of the substrate and the programmed position is out of the allowable range, based on the positional error information from the calculation means.

* * * * *